United States Patent [19]
Chan et al.

[11] Patent Number: 6,031,777
[45] Date of Patent: Feb. 29, 2000

[54] FAST ON-CHIP CURRENT MEASUREMENT CIRCUIT AND METHOD FOR USE WITH MEMORY ARRAY CIRCUITS

[75] Inventors: Julia S. C. Chan, Saratoga; Paul Jei-Zen Song, Sunnyvale, both of Calif.

[73] Assignees: Integrated Silicon Solution, Inc.; Nexflash Technologies, Inc., both of Santa Clara, Calif.

[21] Appl. No.: 09/095,176

[22] Filed: Jun. 10, 1998

[51] Int. Cl.$^7$ ..................................................... G11C 7/02
[52] U.S. Cl. ..................................... 365/210; 365/189.07
[58] Field of Search ................................ 365/210, 189.07

[56] References Cited

U.S. PATENT DOCUMENTS 5,481,178   1/1996   Wilcox et al. .......................... 323/287

*Primary Examiner*—David Nelms
*Assistant Examiner*—M. Tran
*Attorney, Agent, or Firm*—Pennie & Edmonds LLP

[57] ABSTRACT

A high speed memory cell current measurement circuit uses an on-chip reference current circuit that generates a reference current Iref. The reference current circuit includes a first current source transistor. An on-chip current comparison circuit has a second current source transistor that is coupled to the first current source transistor so as to mirror the reference current Iref at a fixed current ratio WR. The current comparison circuit has a current connection path connecting the second current source transistor to a memory cell in the semiconductor memory device whose current is to be compared with Iref/WR. The memory cell is selected from the cells in a memory array using the device's on-chip address decoder circuitry. An on-chip result generation subcircuit, coupled to the current connection path between the second current source transistor and the memory cell, produces a Result signal that indicates whether current flowing through the memory cell is more or less than Iref/WR. In one mode of operation the on-chip reference current circuit is coupled to an on-chip connection pad suitable for connection to an external current source that determines the reference current. In another mode of operation the on-chip reference current circuit is coupled to a dummy memory cell. In this mode the reference current is determined by current drawn by the dummy memory cell. The voltage applied to the dummy memory cell's gate can be externally controlled, thereby allowing external control of the amount of the dummy memory cell's current.

12 Claims, 2 Drawing Sheets

6,031,777

FAST ON-CHIP CURRENT MEASUREMENT CIRCUIT AND METHOD FOR USE WITH MEMORY ARRAY CIRCUITS

The present invention relates generally to circuits and methods for measuring the current drawn by a memory cell in a memory array circuit, and particularly to a high speed on-chip current measurement circuit and current measurement method for measuring the current drawn by a memory cell.

BACKGROUND OF THE INVENTION

During the process of manufacturing memory circuits, as well as other semiconductor circuits, numerous copies of the circuits are manufactured simultaneously on a wafer. Each copy of the circuit is on a separate rectangular "die" on the wafer. The die on the wafer are each tested prior to packaging to determine which of the die should be packaged and which should be rejected. The die that pass all relevant tests are said to qualify for packaging.

When a memory array circuit, such as flash memory circuit, is being tested prior to packaging, the circuit is subjected to numerous tests before qualifying the circuit for packaging. One of the tests to which the memory array circuit can be subjected is a memory cell "IV" characteristics determination test, where "IV" stands for "current-voltage". The current-voltage characteristics of Individual cells are measured, for instance to determine the leakage current of "high threshold voltage" cells, which should ideally leak almost no current, to determine the current drawn by "low threshold voltage" cells, and to determine the threshold voltage of various memory cells in the circuit.

The standard way of measuring a memory cell's current is to connect a selected memory cell to a I/O pad, using circuits enabled only during a special testing mode of operation, and then to use an external current measurement circuit to measure the current drawn by the selected memory cell. The primary problem with this technique is that it is slow. More specifically, due to very small currents being measured (e.g., ranging from 5 to 200 microamps for a typical flash memory cell) and the nature of the external current measurement circuits used, measuring the memory cell current typically takes at least 100 microseconds, and sometimes as long as a few milliseconds. Since numerous current measurements may need to be taken on memory cells in each memory array, these types of measurements can significantly slow down die testing of memory array circuits.

It is therefore a goal of the present invention to provide a current measurement circuit and method for measuring memory cell currents much more rapidly than the external circuit measurement circuits described above, preferably in about 100 nanoseconds.

Another goal of the present invention is to provide a current measurement circuit and method for measuring memory cell currents that is inexpensive to implement.

Yet another goal of the present invention is to provide a current measurement circuit and method for rapidly measuring any specific device current in any semiconductor circuit.

SUMMARY OF THE INVENTION

In summary, the present invention is a circuit for high speed measurement of a current flow in a semiconductor device. An on-chip reference current circuit generates a reference current Iref. The reference current circuit includes a first current source transistor. An on-chip current comparison circuit has a second current source transistor that is coupled to the first current source transistor so as to mirror the reference current Iref at a fixed current ratio WR that is determined by relative sizes of the first and second current source transistors.

The current comparison circuit has a current connection path connecting the second current source transistor to a determined subcircuit in the semiconductor memory device whose current is to be compared with Iref/WR. If the determined subcircuit whose current is to be measured is a memory cell, the memory cell is selected from the cells in a memory array using the device's on-chip address decoder circuitry. An on-chip result generation subcircuit, coupled to the current connection path between the second current source transistor and the determined subcircuit, produces a Result signal that indicates whether current flowing through the determined subcircuit, is more or less than Iref/WR.

In one mode of operation the on-chip reference current circuit is coupled to an on-chip connection pad suitable for connection to an external current source. In this mode the reference current Iref is determined by the external current source. In another mode of operation the on-chip reference current circuit is coupled to an on-chip reference current determining subcircuit substantially similar to the determined subcircuit. In this mode the reference current is determined by current drawn by the on-chip reference current determining subcircuit. Voltages applied to the on-chip reference current determining subcircuit can be externally controlled, thereby allowing external control of the amount of the current drawn by the on-chip reference current determining subcircuit.

The current flow measurement circuit generates current comparison Result signals at very quickly, thereby enabling high speed measurement of currents in a semiconductor device.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
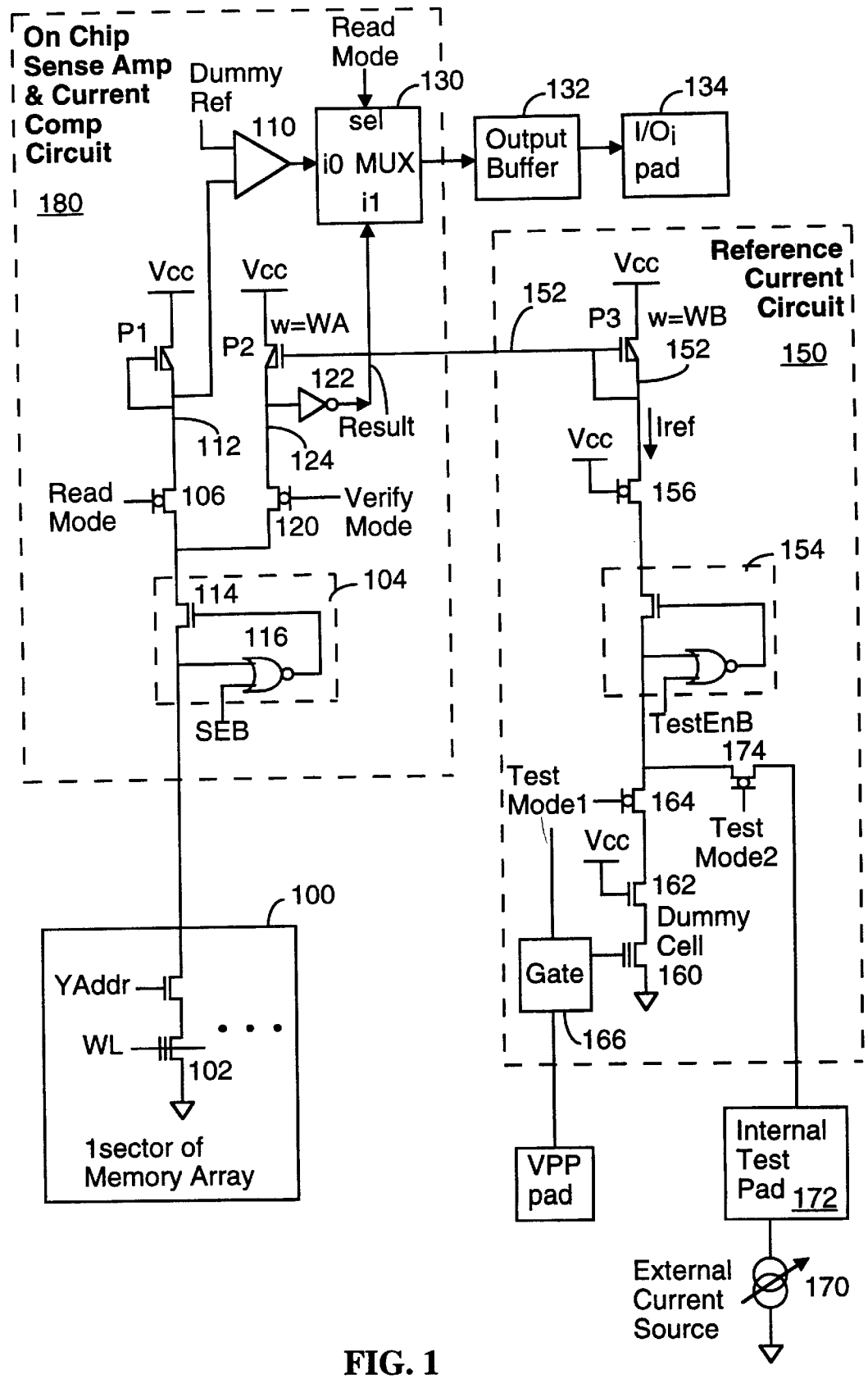
FIG. 1 is a circuit diagram of a preferred embodiment of an on-chip current measurement circuit for measuring flash memory cell currents in accordance with the present invention.

Referring to FIG. 1, box 100 schematically represents one sector of a flash memory array. For example, if the flash memory array is a 128K×8 array, the array will have eight sectors, one for each parallel output bit. A suitable combination of X and Y address decoders, not shown here, are used to select a single memory cell 102 in the sector, and to connect the selected cell to a sense amplifier, commonly called a "sense amp."

The memory device is said to be in its Read Mode whenever it is accessing and outputting the data stored in the location(s) specified by the asserted address signals, which for a 128K×8 device would typically be labeled A16-A0.

The memory device is not in Read Mode when its cells are being programmed or erased, when the device's CE (chip enable) is off, and when any of a number of special test modes are enabled.

The components of the sense amplifier for one sector of the memory array, which in a preferred embodiment are conventional and well understood by those skilled in the art, are:

- a protection circuit 104 for protecting the sense amp from high voltages used during cell programming and erasing;
- a native mode (low threshold) n-channel transistor 106, also called the Read Mode pass transistor, that connects the selected cell to the sensing circuitry whenever the memory array device is in the Read Mode;
- a p-channel pull up transistor P1; and
- differential amplifier 110 that compares the voltage on node 112, between the p-channel pull up transistor and the Read Mode pass transistor 106, with a "dummy reference" voltage that represents the voltage break point between the 0 and 1 data values.

The protection circuit 104 includes an n-channel pass gate 114 and a NOR gate 116. Whenever the sense amp is not enabled (which is basically, whenever the memory device is not in Read Mode), the signal SEB ("Sense amp Enabled Bar") is set to high voltage (e.g., Vcc) by an internal device state determination logic circuit 220 (see FIG. 2). When the sense amp is enabled, SEB is set to a low voltage (typically Vss or circuit ground). The NOR gate 116 disables the pass gate 114 whenever the sense amp is not enabled, thereby isolating the P1 pull up and differential amplifier 110 circuits from the high voltages used for programming and erasing cells in the memory array 100.

Current Measurement Circuit

The current measurement circuitry of the present invention is enabled when the memory device in the Verify Mode. Read Mode is automatically disabled whenever the device is in Verify Mode. The current measurement circuit consists of a native mode transistor 120, a p-channel current source transistor P2, an inverter 122, and a reference current circuit 150. The inverter 122 outputs a binary (0 or 1) Result signal, which is conveyed by multiplexer 130 to an output buffer 132, which amplifies the Result signal and asserts it on an I/O pad 134 corresponding to the memory array sector of the memory cell whose current is being measured. When the memory array is in Read Mode the multiplexer 130 conveys the binary value of the data read by the sense amplifier from a selected memory cell to the output buffer 132.

Native mode n-channel transistor 120 is coupled on one side to node 124, between the protection circuit 104 and the sense amplifier circuitry, and to node 124 on the other. P-channel transistor P2 is a very long channel transistor that acts as a current source. P-channel transistor P3 in the current reference circuit 150 has the identical channel length as transistor P2. Long channel transistors are used for P2 and P3 because these long channel transistors have very stable drain-source current over a relatively large range of gate-source voltages, which makes them relatively good current sources. Conversely, very small changes in the drain-source current through transistor P2 cause a relatively large swing in the device's gate-source voltage.

The amount of current sourced by transistor P2 is determined by (A) the current through p-channel transistor P3 in the reference current circuit 150 and the ratio of the P2 and P3 channel widths WA:WB. Restated, transistors P2 and P3 form a current mirror, where transistor P2 mirrors the current going through the reference current circuit 150, scaled by the ratio of the P2 and P3 channel widths. When the ratio WA/WB=2, the current sourced by P2 is equal to twice the reference current Iref flowing through the reference current circuit at node 152.

When the ratio WA/WB=0.10, the current sourced by P2 is equal to one tenth the reference current Iref flowing through the reference current circuit at node 152. By using a low WA/WB ration such as 0.10 or 0.05, relatively high external reference currents, which are easier to reliable generate and control, can be used to accurately measure the much smaller current levels associated with individual memory cells. In one preferred embodiment, the WA/WB ratio is set equal to 0.10.

Reference Current Circuit

The reference current circuit 150 has two modes of operation: one that uses a dummy cell to generate a reference current, and one that use an external current source to generate the reference current. In order to match the current path characteristics of the current measurement circuit, the reference current circuit 150 includes:

- a protection circuit 154 that is substantially the same as the protection circuit 104 in the sense amplifier signal path;
- a native mode pass transistor 156 that is substantially the same as the Read Mode and Verify Mode transistors 106, 120; and
- a p-channel transistor P3 that has the same long channel length (but not necessarily the same channel width) as transistor P2.

As indicated earlier, the width, WB, of p-channel transistor P3 is not necessarily the same as the width, WA, of transistor P2.

When the TestMode1 signal is enabled (i.e., at a high voltage such as Vcc), a reference current is generated by a dummy cell 160, which is substantially the same as the flash memory cells in the main memory array. The dummy cell 160 is connected to the main current path of the reference current circuit by (A) an n-channel pass transistor 162 that is substantially the same as the final Y decoder transistor for each memory array sector in the memory array, connected in series with (B) a native mode pass transistor 164 that is gated by the TestMode1 signal. The voltage on the control gate of the dummy cell 160 is externally controlled by asserting the control gate voltage on the VPP pad of the device. For instance, a voltage of Vcc+0.2 v might be applied to the VPP pad to simulate the control gate voltage conveyed to the memory cells by an internally-boosted word line. A charge pumped gate 166 conveys the VPP pad voltage to control gate of the dummy cell 160 so that voltages higher than Vcc can be asserted on the dummy cell's control gate. When TestMode1 is enabled, TestMode2 is disabled.

When the TestMode2 signal is enabled (i.e., at a high voltage such as Vcc), a reference current is generated by an external current reference 170. The external current reference 170 is connected to a special internal test pad 172, which is in turn connected by a native mode n-channel transistor 174 gated by the TestMode2 signal to the main current path of the reference current circuit 150.

Operation of the Current Measurement Circuit

When the memory device is in Verify Mode, the current measurement circuit compares the amount of current sourced by transistor P2 with the amount of current drawn by the memory cell selected by the address signals currently asserted on the address lines. The amount of current sourced by transistor P2 is called the test current level.

If transistor P2 is sourcing more current than the cell is drawing, the voltage on node 124 quickly goes high (due to the very high resistance of transistor P2), causing the Result signal to go low. As a result, a low voltage or binary 0 value is output on the I/O pad 134.

If transistor P2 is sourcing less current than the cell is drawing, the voltage on node 124 quickly goes low, causing the Result signal to go high. As a result, a low voltage or binary 1 value is output on the I/O pad 134.

In summary, the measurement Result is equal to 0 if the memory cell current is less than the test current level and is equal to 1 if the memory cell current is more than the test current level.

Furthermore, generation of the Result signal and the corresponding signal on the I/O pad is fast, typically in less than 100 nanoseconds from the time a new memory cell is selected, or the time a new reference current is asserted, until the time a new valid Result is available on the I/O pad. The current measurement circuit of the present invention is fast in large part because the current comparison operation is performed on-chip, which enables the currents in the measurement circuit to quickly settle to stable values. After the currents in the measurement circuit settle, the Result is generated by inverter 122. The amount of time required to assert the Result on the I/O pad is simply the normal data path time from the sense amplifier to the I/O pad of the memory device, which is typically less than ten nanoseconds.

When the TestMode1 signal is enabled, the reference current Iref is generated by the dummy cell 160, which is programmed or erased using conventional techniques. The control gate voltage is directly set by the voltage on the memory device's VPP Pad. For instance, the VPP Pad voltage can be set to Vcc+0.2 volts to simulate the voltage level on an internally-boosted word line. Manipulation of the control gate voltage on the dummy cell 160 can be used to measure the memory cell current and determine the threshold voltage of the memory cell for different memory cell conditions. For example, the VPP voltage could be forced to around 6.5 volts to measure the programmed memory cell current and determine the programmed memory cell's threshold voltage. The VPP voltage could then be forced to approximately 2 volts to measure an erase memory cell's threshold voltage, and so on.

When the TestMode2 signal is enabled, the reference current Iref is generated by the external current source 170. By varying the level of the reference current Iref in a number of programmed steps and reading the Result signal at each reference current level, the memory cell current can be measured. More particularly, by using a standard binary search methodology, in which the external reference current level is varied in accordance with the Result value produced when applying prior reference current levels, a tester can quickly determine the memory cell current to a desired level of accuracy. Furthermore, by measuring the memory cell current while changing the supply voltage Vcc applied to the entire memory device level to a sequence of different voltage levels, the threshold voltage of the selected memory cell can be mathematically determined, using well known equation solving techniques.

Context of the Current Measurement Circuit

Still referring to FIG. 1, the on-chip sense amplifier and current measurement circuit, collectively referenced by box 180, is repeated for each sector of the memory array. Thus a memory device with eight memory array sectors and eight parallel data I/O pads will have eight copies of the on-chip sense amplifier and current measurement circuit 180. On the other hand, just one copy of the reference current circuit 150 is needed, with control node 152 being connected to the gate of transistor P2 in each of the current measurement circuits, regardless of the number of current measurement circuits.

Figure 2:
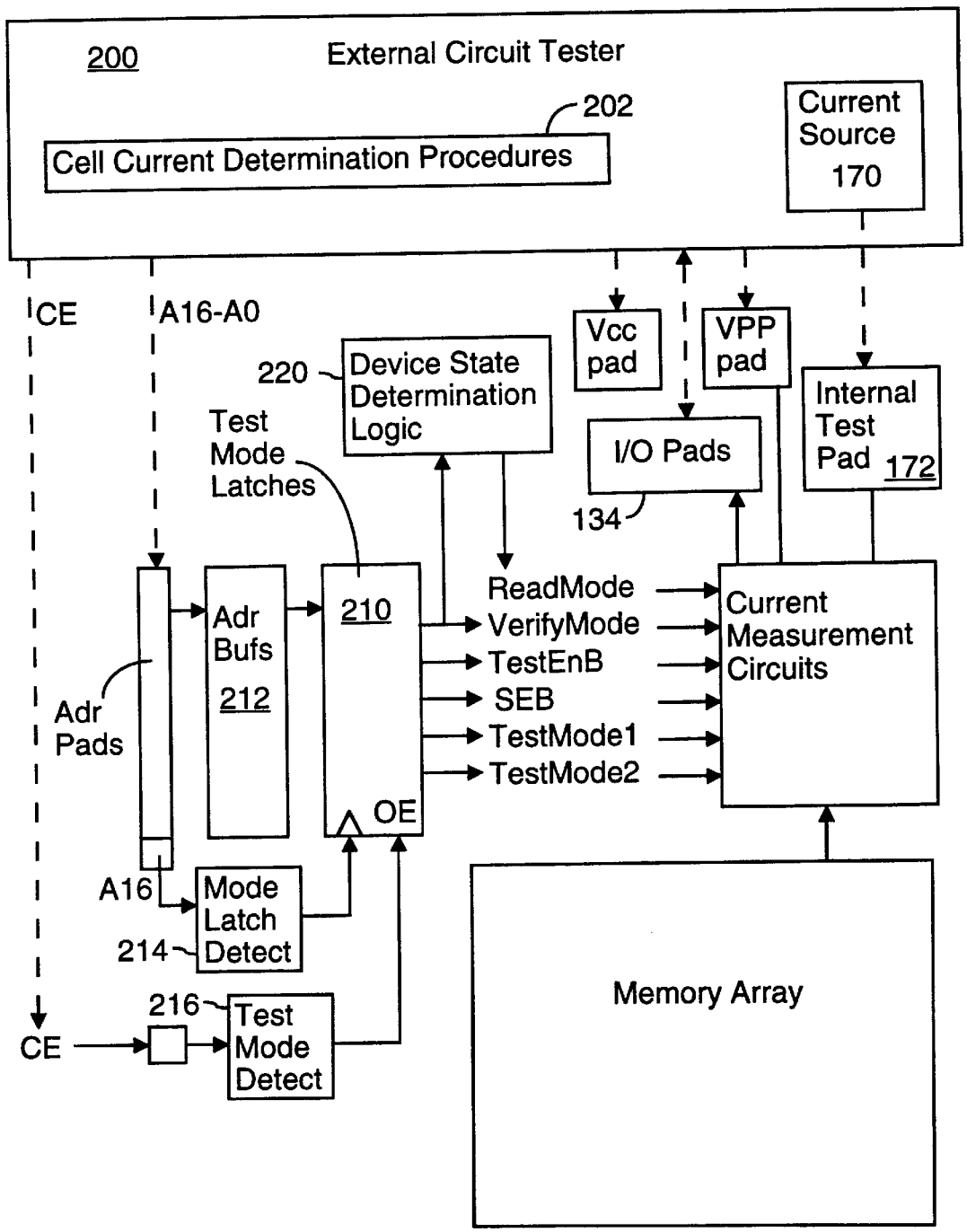
FIG. 2 is a block diagram of a flash memory array device incorporating a preferred embodiment of an on-chip current measurement circuit for measuring flash memory cell currents in accordance with the present invention.

Referring to FIG. 2, the on-chip current measurement circuit is typically used by an external circuit tester 200 to measure memory cell current and to determine memory cell threshold voltages under various programming conditions. The tester 200 is typically controlled by a programmable computer that executes a number of test procedures. When used in conjunction with the present invention, the tester will preferably include a set of cell current determination procedures 202, which may also include memory cell threshold determination procedures or instructions.

In a preferred embodiment, the memory device contains a set of test mode latches 210 that are coupled to the device's address buffers 212. When a special voltage pattern is asserted on one of the device's connection pads, such as 10 V to 0 V transition on the A16 address pad, the data values on a set of the address lines are stored in the test mode latches 210. A mode latch detection circuit 214 detects the special voltage pattern on the relevant external pad and generates the clock or latch signal required for storing the mode values in the latches 210. The storage of these values in the test mode latches does not, by itself, put the memory device in a test mode. Rather, it stores the mode values to be used once the device is put into any of a number of special test modes. Some of the test mode latches 210 have both positive and negative logic outputs. For instance, the same latch that outputs the VerifyMode signal also outputs the TestEnB signal, which is just the inverse of the VerifyMode signal.

The current measurement test mode is invoked by asserting a special voltage pattern on one of the device's connection pads. For instance, when a high voltage (10 v) signal is asserted on the chip enable (CE) pad, this voltage pattern is detected by a test mode detection circuit 216, which then enables the assertion of the VerifyMode signal. The VerifyMode signal, as well as several other signals not relevant here, are used by device state determination logic 220 to deactivate the ReadMode signal whenever the memory device is in any of the testing modes that are incompatible with ReadMode operation, as well as when the device is in programming or erase mode.

Alternate Embodiments

The present invention can be used for high speed measurement of on-chip currents in devices other than flash memory devices. For instance, very similar circuitry could be used to measure memory cell currents in DRAM, SRAM and other types of memory devices. Also, with appropriate test mode current path control gates, very similar circuitry could be used to measure the current flowing through virtually any important on-chip subcircuit in other types of semiconductor devices.

While the present invention has been described with reference to a few specific embodiments, the description is illustrative of the invention and is not to be construed as limiting the invention. Various modifications may occur to those skilled in the art without departing from the true sp irit and scope of the invention as defined by the appended claims.

What is claimed is:

1. A circuit for high speed measurement of a current flow in a semiconductor device, comprising:

an on-chip reference current circuit for generating a reference current Iref, the reference current circuit including a first current source transistor;

an on-chip current comparison circuit having a second current source transistor that is coupled to the first current source transistor so as to mirror the reference current Iref at a fixed current ratio WR determined by relative sizes of the first and second current source transistors;

the current comparison circuit including a current connection path connecting the second current source transistor to a determined subcircuit in the semiconductor device whose current is to be compared with Iref/WR; and an on-chip result generation subcircuit electrically coupled to the current connection path between the second current source transistor and the determined subcircuit for producing a Result signal that indicates whether current flowing through the determined subcircuit is more or less than Iref/WR;

wherein the on-chip reference current circuit is coupled to an on-chip connection pad suitable for connection to an external current source, wherein the reference current Iref is determined by the external current source.

2. A circuit for high speed measurement of a current flow in a semiconductor device, comprising:

an on-chip reference current circuit for generating a reference current Iref, the reference current circuit including a first current source transistor;

an on-chip current comparison circuit having a second current source transistor that is coupled to the first current source transistor so as to mirror the reference current Iref at a fixed current ratio WR determined by relative sizes of the first and second current source transistors;

the current comparison circuit including a current connection path connecting the second current source transistor to a determined subcircuit in the semiconductor device whose current is to be compared with Iref/WR; and an on-chip result generation subcircuit electrically coupled to the current connection path between the second current source transistor and the determined subcircuit for producing a Result signal that indicates whether current flowing through the determined subcircuit is more or less than Iref/WR;

wherein the on-chip reference current circuit is coupled to an on-chip reference current determining subcircuit substantially similar to the determined subcircuit, wherein the reference current is determined by the reference current determining subcircuit.

3. A circuit for high speed measurement of a current flow in a semiconductor device, comprising:

an on-chip reference current circuit for generating a reference current Iref, the reference current circuit including a first current source transistor;

an on-chip current comparison circuit having a second current source transistor that is coupled to the first current source transistor so as to mirror the reference current Iref at a fixed current ratio WR determined by relative sizes of the first and second current source transistors;

the current comparison circuit including a current connection path connecting the second current source transistor to a determined subcircuit in the semiconductor device whose current is to be compared with Iref/WR; and an on-chip result generation subcircuit electrically coupled to the current connection path between the second current source transistor and the determined subcircuit for producing a Result signal that indicates whether current flowing through the determined subcircuit is more or less than Iref/WR;

wherein the on-chip reference current circuit has a plurality of operating modes, wherein in a first operating mode the reference current is determined by an external current source coupled to the on-chip reference current circuit by an on-chip connection pad, and in a second operating mode the reference current is determined by an on-chip reference current determining subcircuit substantially similar to the determined subcircuit.

4. A circuit for high speed measurement of memory cell current flow in a semiconductor memory device, the memory device including an array of memory cells and circuitry for selecting a memory cell in the array in accordance with an asserted set of address signals, the circuit comprising:

an on-chip reference current circuit for generating a reference current Iref, the reference current circuit including a first current source transistor;

an on-chip current comparison circuit having a second current source transistor that is coupled to the first current source transistor so as to mirror the reference current Iref at a fixed current ratio WR determined by relative sizes of the first and second current source transistors;

the current comparison circuit including a current connection path connecting the second current source transistor to a memory cell in the array of memory cells in the semiconductor memory device whose current is to be compared with Iref/WR; wherein the memory cell whose current is to be compared is selected in accordance with said asserted set of address signals; and an on-chip result generation subcircuit electrically coupled to the current connection path between the second current source transistor and the memory cell for producing a Result signal that indicates whether current flowing through the memory cell is more or less than Iref/WR.

5. The circuit of claim 4, wherein the on-chip reference current circuit is coupled to an on-chip connection pad suitable for connection to an external current source, wherein the reference current Iref is determined by the external current source.

6. The circuit of claim 4, wherein the on-chip reference current circuit is coupled to a dummy memory cell subcircuit substantially similar to the memory cell, wherein the reference current is determined by current drawn by the dummy memory cell.

7. The circuit of claim 6, wherein the reference current circuit includes means for controlling voltages applied to the dummy memory cell so as to control the current drawn by the dummy memory cell.

8. The circuit of claim 4, wherein the on-chip reference current circuit has a plurality of operating modes, wherein in a first operating mode the reference current is determined by an external current source coupled to the on-chip reference current circuit by an on-chip connection pad, and in a second operating mode the reference current is determined by an on-chip dummy memory cell substantially similar to the memory cell.

9. A circuit for high speed measurement of memory cell current flow in a semiconductor memory device, comprising:

an on-chip reference current circuit for generating a reference current Iref, the reference current circuit including a first current source transistor;

an on-chip current comparison circuit having a second current source transistor that is coupled to the first current source transistor so as to mirror the reference current Iref at a fixed current ratio WR determined by relative sizes of the first and second current source transistors;

the current comparison circuit including a current connection path connecting the second current source transistor to a memory cell in the semiconductor memory device whose current is to be compared with Iref/WR; and an on-chip result generation subcircuit electrically coupled to the current connection path between the second current source transistor and the memory cell for producing a Result signal that indicates whether current flowing through the memory cell is more or less than Iref/WR;

wherein the on-chip reference current circuit is coupled to an on-chip connection pad suitable for connection to an external current source, wherein the reference current Iref is determined by the external current source.

10. A circuit for high speed measurement of memory cell current flow in a semiconductor memory device, comprising:

an on-chip reference current circuit for generating a reference current Iref, the reference current circuit including a first current source transistor;

an on-chip current comparison circuit having a second current source transistor that is coupled to the first current source transistor so as to mirror the reference current Iref at a fixed current ratio WR determined by relative sizes of the first and second current source transistors;

the current comparison circuit including a current connection path connecting the second current source transistor to a memory cell in the semiconductor memory device whose current is to be compared with Iref/WR; and an on-chip result generation subcircuit electrically coupled to the current connection path between the second current source transistor and the memory cell for producing a Result signal that indicates whether current flowing through the memory cell is more or less than Iref/WR;

wherein the on-chip reference current circuit is coupled to a dummy memory cell subcircuit substantially similar to the memory cell, wherein the reference current is determined by current drawn by the dummy memory cell.

11. The circuit of claim 10, the reference current circuit including means for controlling voltages applied to the dummy memory cell so as to control the current drawn by the dummy memory cell.

12. A circuit for high speed measurement of memory cell current flow in a semiconductor memory device, comprising:

an on-chip reference current circuit for generating a reference current Iref, the reference current circuit including a first current source transistor;

an on-chip current comparison circuit having a second current source transistor that is coupled to the first current source transistor so as to mirror the reference current Iref at a fixed current ratio WR determined by relative sizes of the first and second current source transistors;

the current comparison circuit including a current connection path connecting the second current source transistor to a memory cell in the semiconductor memory device whose current is to be compared with Iref/WR; and an on-chip result generation subcircuit electrically coupled to the current connection path between the second current source transistor and the memory cell for producing a Result signal that indicates whether current flowing through the memory cell is more or less than Iref/WR;

wherein the on-chip reference current circuit has a plurality of operating modes, wherein in a first operating mode the reference current is determined by an external current source coupled to the on-chip reference current circuit by an on-chip connection pad, and in a second operating mode the reference current is determined by an on-chip dummy memory cell substantially similar to the memory cell.

\* \* \* \* \*